United States Patent
Lewis et al.

(10) Patent No.: US 9,544,673 B2
(45) Date of Patent: Jan. 10, 2017

(54) MICROPHONE WITH BUILT-IN SPEAKER DRIVER

(71) Applicant: INVENSENSE, Inc., San Jose, CA (US)

(72) Inventors: Jerad M. Lewis, Cambridge, MA (US); Paul M. Schreier, Newton, MA (US); Kieran P. Harney, Andover, MA (US); Joshua C. LeMaire, San Francisco, CA (US); Aleksey S. Khenkin, Nashua, NH (US)

(73) Assignee: INVENSENSE, INC., San Jose, CA (US)

( * ) Notice: Subject to any disclaimer, the term of this patent is extended or adjusted under 35 U.S.C. 154(b) by 65 days.

(21) Appl. No.: 14/580,041

(22) Filed: Dec. 22, 2014

(65) Prior Publication Data
US 2016/0182987 A1    Jun. 23, 2016

(51) Int. Cl.
*H04R 1/04* (2006.01)
*H04R 17/00* (2006.01)
*H04R 19/00* (2006.01)
*H04R 19/04* (2006.01)

(52) U.S. Cl.
CPC .............. *H04R 1/04* (2013.01); *H04R 19/005* (2013.01); *H04R 19/04* (2013.01); *H04R 2201/023* (2013.01)

(58) Field of Classification Search
None
See application file for complete search history.

(56) References Cited

U.S. PATENT DOCUMENTS

| | | | |
|---|---|---|---|
| 2004/0142680 A1* | 7/2004 | Jackson | G11C 27/005 455/412.1 |
| 2007/0191127 A1* | 8/2007 | Sheen | A63B 69/36 473/131 |
| 2010/0284553 A1* | 11/2010 | Conti | B81B 7/0061 381/174 |
| 2014/0103464 A1* | 4/2014 | Bolognia | H04R 1/04 257/416 |
| 2014/0257813 A1* | 9/2014 | Mortensen | G10L 15/02 704/251 |
| 2015/0006181 A1* | 1/2015 | Fan | H04R 1/08 704/270 |
| 2015/0373460 A1* | 12/2015 | Huang | H04R 1/02 381/190 |

OTHER PUBLICATIONS

"Full Digital Amplifier for Mobile and Handheld Devices", John J.-H Oh, AES 29th International Conference, Seoul, Korea, Sep. 2-4, 2006, pp. 1-5.*

\* cited by examiner

*Primary Examiner* — Brenda Bernardi
(74) *Attorney, Agent, or Firm* — Amin, Turocy & Watson, LLP

(57) ABSTRACT

A microphone package is integrated with a built-in speaker driver. A microphone application-specific integrated circuit (ASIC) and the speaker driver can be directly coupled to an external application processor, eliminating a need for a codec and thus, reducing the size, cost, and/or complexity of a device. In one aspect, the speaker driver and the microphone ASIC are implemented as separate dice mounted on the package substrate. In another aspect, the speaker driver and the microphone ASIC are implemented as stacked die on the package substrate. In yet another aspect, the speaker driver and the microphone ASIC are implemented as a single die on the package substrate.

27 Claims, 13 Drawing Sheets

MICROPHONE WITH BUILT-IN SPEAKER DRIVER

TECHNICAL FIELD

The subject disclosure relates to microphone devices, e.g., to a speaker driver integrated within a microphone package.

BACKGROUND

A microphone is a device that converts acoustic signals (e.g., sound waves) to electrical signals that can be transmitted, processed and/or amplified to facilitate presentation of the audio (e.g., transmission of the audio, via electronic signals, to another electronic device for presentation and/or further processing). There are different types of microphones that can be used for a variety of types of applications and/or in a variety of types of electronic devices. Microphones can be used as a stand-alone device, for example, by singers while singing on stage or speakers while giving speeches. Microphones also can be employed in electronic devices, such as, for example, telephones (e.g., mobile phones, landline phones), computers, electronic pads or tablets, electronic games, or audio and/or video recording devices, to facilitate receiving and processing voice or other audio sounds. Recently the use of microphones in wearable devices, such as, smart watches, activity trackers and/or Bluetooth® accessories is gaining popularity.

Conventional wearable devices primarily utilize microphones to receive and/or record audio input (e.g., voice commands) from a user. Typically, the microphones provide a digital audio output that is further processed by an application processor. Since the audio input is not transmitted to a speaker, the need for utilization of an audio codec (coder-decoder) or other device can be eliminated. Accordingly, the size of the microphone package can be kept small so as to make the wearable device lightweight and compact. However, user demand for applications that can present audio outputs (e.g., via a speaker) is in conflict with the desire to provide lightweight and compact wearable devices.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

The systems and methods described herein, in one or more embodiments thereof, relate to a microphone with a built-in speaker driver. In one aspect, the system disclosed herein comprises a microphone package that includes a microphone application-specific integrated circuit (ASIC) coupled to a microphone transducer that generates a digital audio output signal based on sensing an acoustical signal. Further, the microphone package includes a speaker driver that generates, based on a digital audio input signal, a drive signal employable to drive a speaker (e.g., a piezo speaker driver that drives a piezo speaker).

Furthermore, an aspect of the disclosed subject matter relates to a method that comprises implementing a microphone transducer within a package and coupling the microphone transducer to a microphone ASIC implemented within the package. The method further comprises implementing a speaker driver within the same package. As an example, a piezo speaker driver that drives a piezo speaker can be implemented within the package.

Additionally, yet another aspect of the disclosed subject matter relates to an integrated circuit that comprises a microphone ASIC coupled to a microphone transducer that is configured to direct, to an external device, a digital audio output signal that is determined based on sensing an acoustical signal and a speaker driver that is configured to generate, based on a digital audio input signal received from the external device, a drive signal employable to drive a speaker, wherein the microphone ASIC and the speaker driver are implemented within a common package. As an example, the integrated circuit can be utilized in wearable device, such as, but not limited to, smart watches, smart glasses/goggles, medical/fitness/activity monitors and/or trackers, etc.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
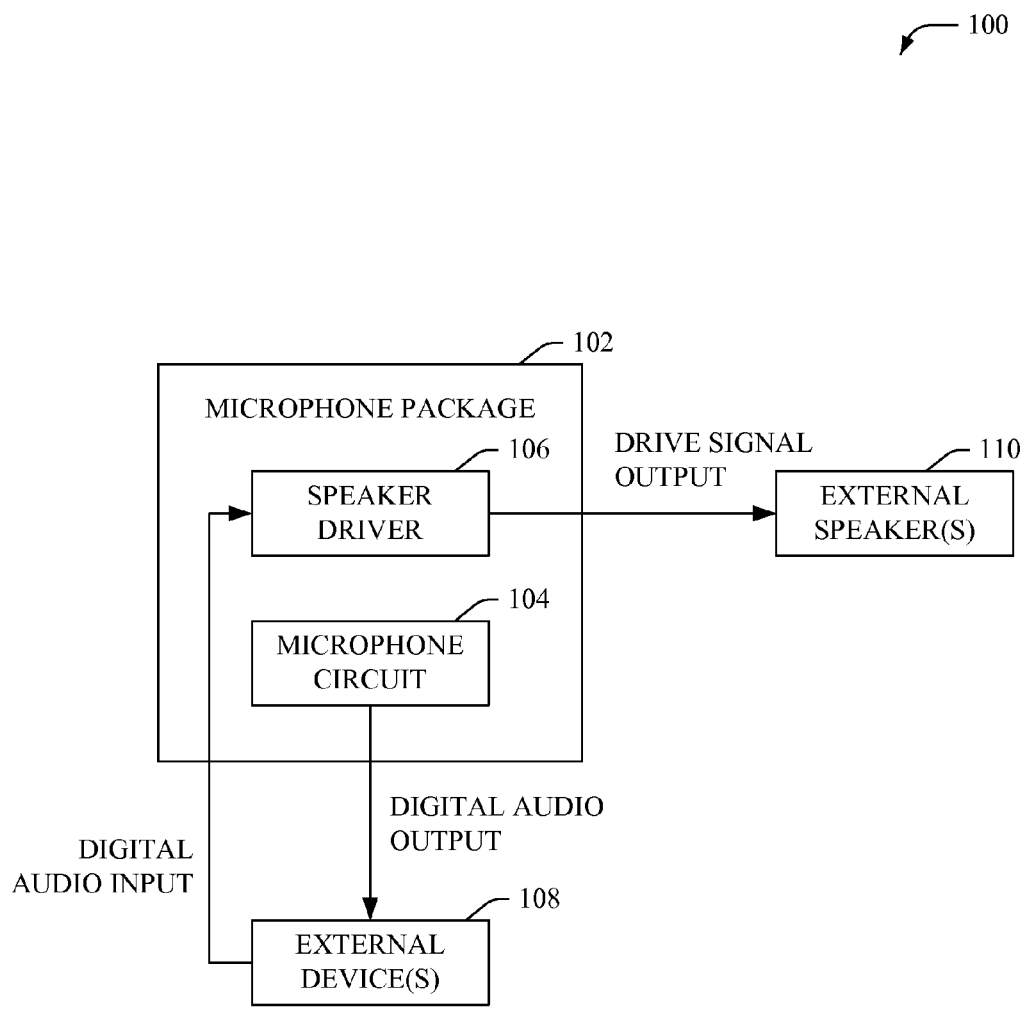
FIG. 1 illustrates an example system comprising a common package that can be utilized for sensing and driving an acoustic/audio signal.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

Systems and methods disclosed herein, in one or more aspects, integrate a speaker driver within a microphone package and eliminate the need for utilization of codec (coder-decoder) devices. In the described embodiments, an integrated circuit (IC) substrate can refer to a silicon substrate with electrical circuits, typically complementary metal-oxide-semiconductor (CMOS) circuits. Also, a CMOS IC substrate can include an application-specific integrated-circuit (ASIC). A cavity can refer to a recess in a substrate, a lid (cover), or a casing. An enclosure can refer to a fully enclosed or substantially fully enclosed volume typically surrounding a microelectrical-mechanical systems (MEMS) structure and typically formed by the IC substrate, a structural layer, a MEMS substrate, and/or other components or structures. A port can be an opening through a substrate to expose the MEMS structure to the surrounding environment. It is to be appreciated that an enclosure can include an acoustic port, in various embodiments of the subject disclosure.

In the described embodiments, a chip can include at least one substrate that typically can be formed from a semiconductor material. A single chip can be formed from multiple substrates, where the substrates can be mechanically bonded to preserve functionality. Multiple chips can include at least two substrates, wherein the two substrates can be electrically connected, but do not require mechanical bonding. A package or casing can provide electrical connection between the bond pads on the chip to a metal pad that can be soldered to a printed circuit board (PCB). A package typically can comprise a substrate and a cover. It is to be appreciated that the package can hermetically seal its components, with the exception that the port opening of the package can allow for air flow in and out of the package. Also, it is to be appreciated that the package can provide an acoustic seal, with the exception that the port opening of the package can allow for sound waves to enter and exit the package.

The subject matter is described with reference to the drawings, wherein like reference numerals are used to refer to like elements throughout. In the following description, for purposes of explanation, numerous specific details are set forth in order to provide a thorough understanding of the subject innovation. However, that the subject matter may be practiced without these specific details.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the words "example" and/or "exemplary" are used herein to mean serving as an example, instance, or illustration. Any aspect or design described herein as "example" and/or "exemplary" is not necessarily to be construed as preferred or advantageous over other aspects or designs. Rather, use of the word exemplary is intended to present concepts in a concrete fashion.

Initially, referring to FIG. 1 there illustrated is an example system 100 comprising a common package that can be utilized for sensing and driving an acoustic/audio signal. In one aspect, system 100 comprises a microphone package 102 that can include an audio input/output (I/O) subsystem (e.g., except for a speaker). The audio input/output (I/O) subsystem can comprise a microphone circuit 104 and a speaker driver 106 that reduces the need for additional components, such as, but not limited to codecs.

The system 100 can be included within most any electronic device and can be utilized to convert an audio signal (e.g., sound waves) into mechanical vibrations and/or electrical signals. As an example, system 100 can be utilized in various applications, such as, but not limited to, wireless devices, wearable devices, remote controls, Internet of Things (IoT), industrial systems, automotive systems, robot devices, telecommunication devices, security devices, medical/bio-medical devices, Bluetooth® accessories, etc. In one aspect, the microphone circuit 104 can include a MEMS microphone/acoustic sensor for detecting acoustic waves.

The microphone circuit 104 can be implemented on a solid state integrated circuit (IC) that can be digital, for example, that converts the audio signal into a digital audio output having a standard/defined format (e.g., Inter-IC Sound (I²S), pulse density modulation (PDM), SLIMbus, SoundWire, time division multiplexed (TDM), etc.). The digital audio output from the microphone circuit 104 can be provided to external device(s) 108 (e.g., an application-specific processor) for further signal processing and/or transmission of the signal to a remote processing device (not shown). Further, the external device(s) 108 can provide a digital audio input having a standard/defined format (e.g., I²S, PDM, SLIMbus, SoundWire, TDM, etc.) to the speaker driver 106 within the microphone package 102. In one aspect, the speaker driver 106 can generate a drive signal output by converting the digital audio input to an analog audio signal that can be utilized to drive an external speaker 110 (e.g., a piezo speaker). Since additional devices, such as (but not limited to) codecs, are not utilized by system 100, features, such as, size, cost, complexity, power consumption, etc. can be reduced.

Figure 2:
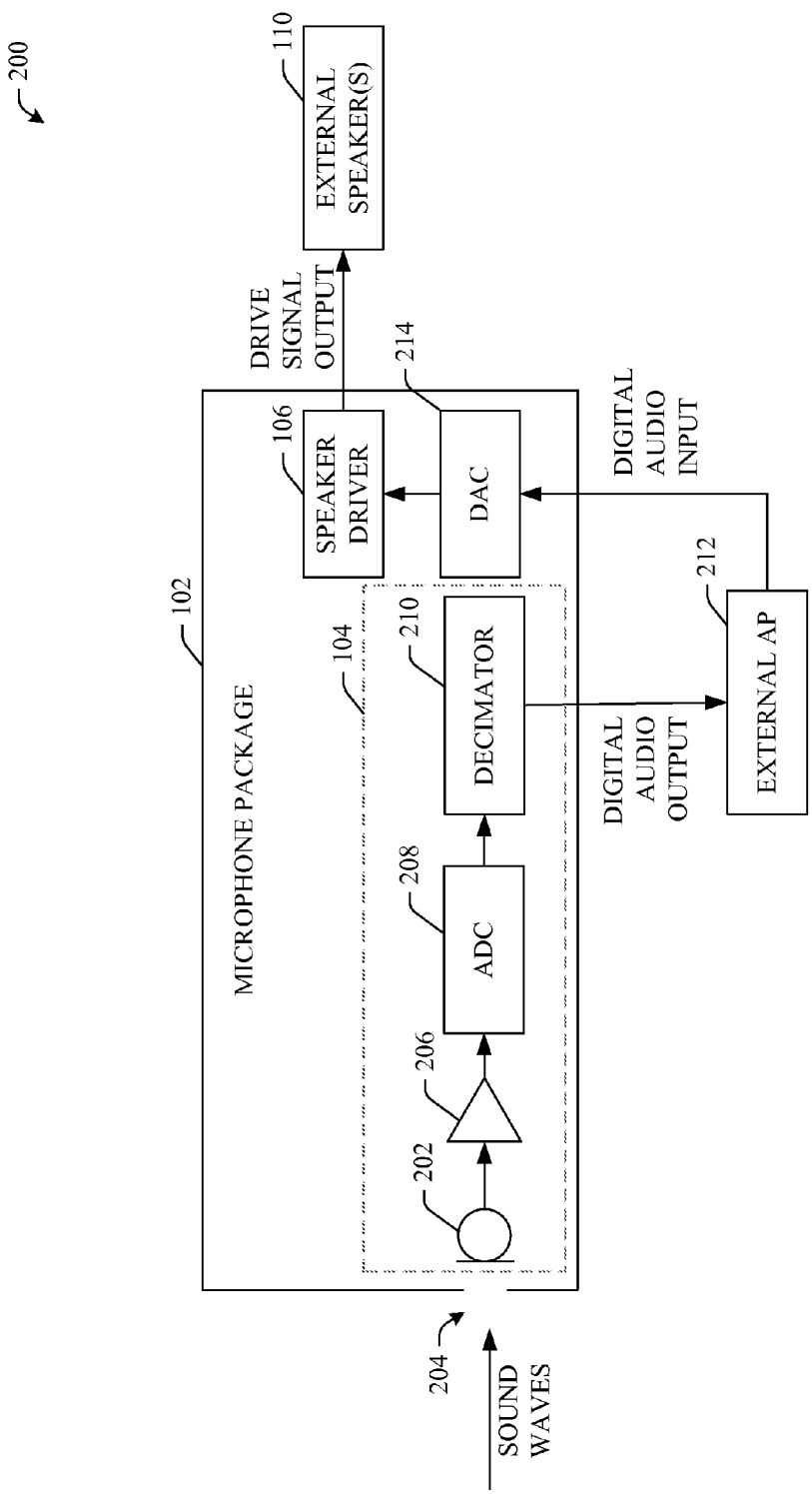
FIG. 2 illustrates an example system comprising a microphone package with a built-in speaker driver.

Referring now to FIG. 2, there illustrated is an example system 200 that comprises a microphone package 102 with a built-in speaker driver 106, according to an aspect of the specification. It is noted that the microphone package 102, microphone circuit 104, speaker driver 106, and external speaker(s) 110 can include functionality as more fully described herein, for example, as described above with regard to system 100.

According to an embodiment, the microphone circuit 104 can include a microphone transducer 202 that receives sound waves through a port hole 204 within the microphone package 102 and converts the sound waves (e.g., acoustical/audio signal) into an electrical signal (e.g., analog signal). As an example, the microphone transducer 202 can be a Microelectromechanical systems (MEMS) microphone comprising a fixed plate (back-plate) and a movable plate (membrane). The MEMS microphone can measure a capacitive change between the fixed plate and the movable plate that is generated when the sound wave passes through the MEMS microphone and moves the membrane modulating the air gap comprised between the two conductive plates. The analog signal generated by the microphone transducer 202 can be amplified by a buffer amplifier 206 and an analog-to-digital converter (ADC) 208 can be employed to convert the amplified analog signal to a digital signal. Typically, the digital signal has a high sample rate. In one aspect, a decimator 210 (e.g., decimation filter) can be utilized to filter the high sample rate digital signal to a defined sampling rate (e.g., baseband rate) and format the digital signal to a defined/standard digital audio format (e.g., $I^2S$).

The digital audio output from the decimator 210 can be provided to an external application processor (AP) 212 (e.g., digital signal processor, microprocessor, digital system-on-chip (SOC), etc.) for additional processing. For example, the external AP 212 can perform natural language possessing to determine instructions, commands, and/or tasks that are to be performed. It can be noted that the external AP 212 can forward the digital audio output (and/or determined commands) to one or more remote devices (not shown) via wired and/or wireless communication links. As an example, the digital audio output conforms to the defined/standard digital audio format (e.g., $I^2S$). In one aspect, the external AP 212 can generate digital audio input that is directed to the microphone package 102. The digital audio input can include (but is not limited to) notifications, alerts, voice messages, etc., that can be input by a user and sensed via the microphone transducer 202 or most any input device (e.g., keypad, touch screen, etc.), generated in response to an event, periodically, at a specific time, based on user/device preferences, etc., and/or received from the one or more remote devices. It is noted that the external AP can be substantially similar to the external devices 108 and can include functionality as more fully described herein, for example, as described above with regard to the external devices 108.

A digital-to-analog converter (DAC) 214 can convert the digital audio output to an analog signal that is provided to the speaker driver 106. As an example, a variety of speaker drivers can be utilized based on the type of speaker (e.g., external speaker(s) 110) that is coupled to the microphone package 102. For example, if a piezo speaker is utilized, a piezo speaker driver can be incorporated within the microphone package 102. The speaker driver 106 can amplify the analog signal and/or format the signal to drive the external speaker(s) 110, which in turn can generate a corresponding acoustic output. Accordingly, the microphone package 102 includes a microphone input path and speaker output path with digital inputs/outputs (e.g., $I^2S$ digital inputs/outputs). As an example, $I^2S$ microphones are typically used in devices that do not require audio output because $I^2S$ devices can interface with the external AP 212 directly, without a codec. Conventionally, a codec has to be added into the system when the device requires a speaker, even a small piezo buzzer. However, system 200 eliminates the need for a codec by incorporating the speaker driver 106 within the microphone package 102 and coupling an external speaker(s) 110 to the microphone package 102.

Figure 3A:
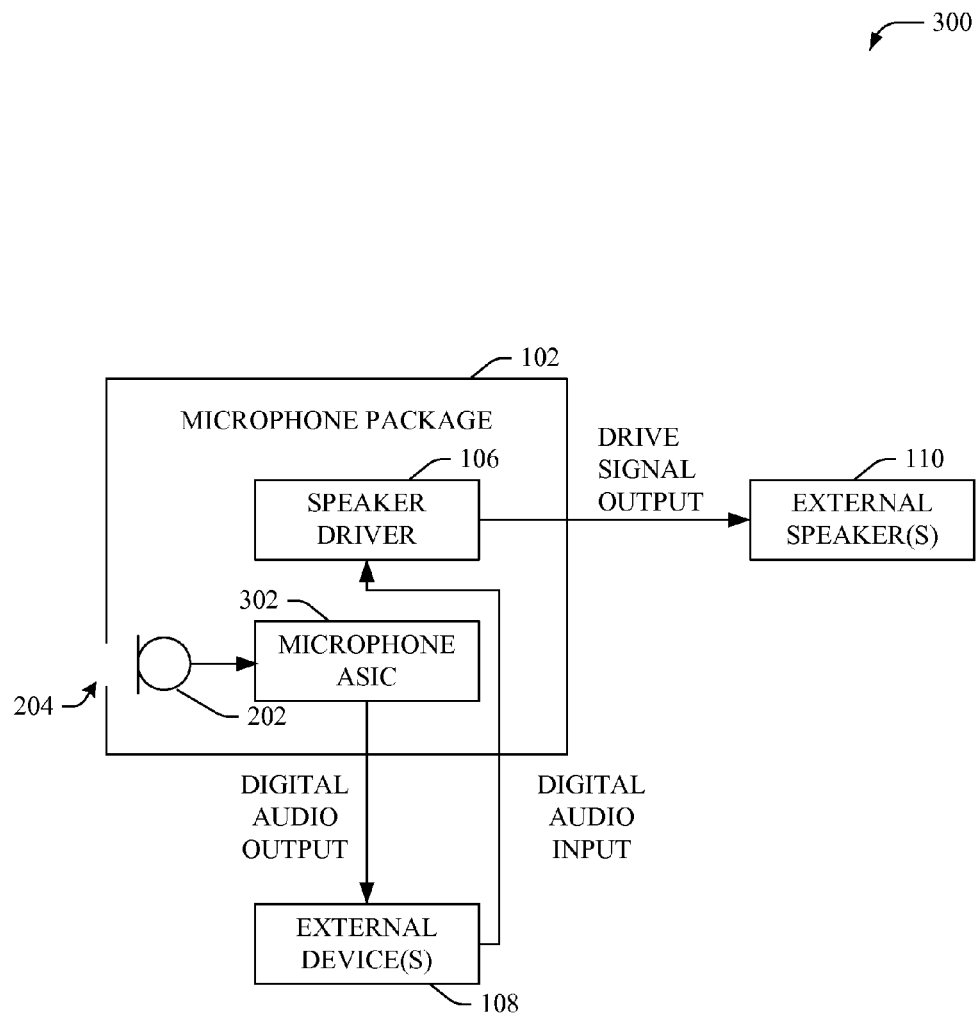
FIGS. 3A and 3B illustrate example systems comprising a speaker driver and a microphone application-specific integrated circuit (ASIC) that are implemented as separate dice mounted on a package substrate.
Figure 3B:
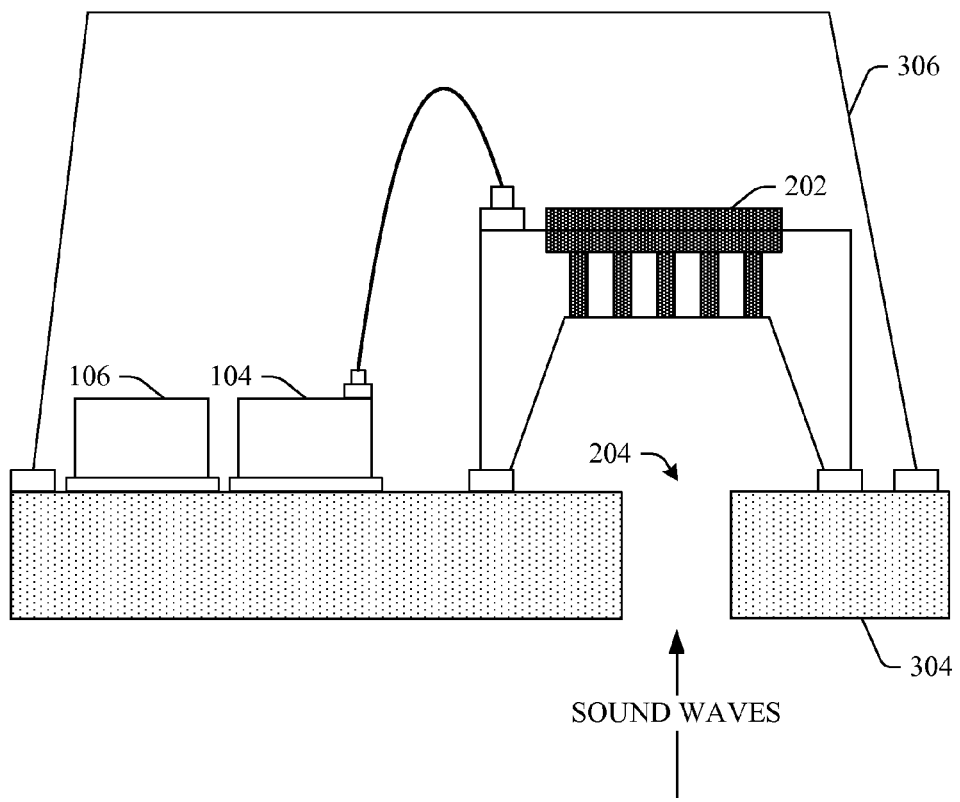

FIGS. 3A and 3B illustrates example systems 300 and 350, wherein a speaker driver 106 and a microphone ASIC 302 are implemented as separate dice mounted on a package substrate. In one aspect, the microphone ASIC 302 can comprise and include functionality associated with the buffer amplifier 206, the ADC 208, and the decimator 210 as more fully described herein, for example, with respect to system 200. It is noted that the microphone package 102, speaker driver 106, external device(s) 108, external speaker(s) 110, microphone transducer 202, and port hole 204 can include functionality as more fully described herein, for example, as described above with regard to systems 100-200. FIG. 3A depicts an example block diagram illustrating the speaker driver 106 and the microphone ASIC 302 implemented as separate dice within the microphone package 102, while FIG. 3B depicts an example cross-sectional side-view of the speaker driver 106 and the microphone ASIC 302 implemented as separate dice within the microphone package 102.

In one aspect, the microphone package 102 can comprise a port hole 204 of a desired size and/or shape in a package substrate 304 for the audio signal to reach the transducer element 202 (e.g., MEMS microphone). Further the microphone package 102 can include a cover 306 (e.g., lid/shield) that is bonded over the substrate 304 and that encapsulates the components (e.g., microphone transducer 202, speaker driver 106 and a microphone ASIC 302) within the microphone package 102. As an example, the cover 306 can be constructed out of one or more desired materials (e.g., plastic, metal, etc.). Inside the microphone package 102, the microphone transducer 202 and the microphone ASIC 302 can be bonded together (e.g., via a wire bond) and mounted on the common substrate 304. In addition, the speaker driver 106 can also be mounted on the common substrate 304. In one aspect, the microphone transducer 202, the microphone ASIC 302, and/or the speaker driver 106 can be electrically coupled to the substrate 304, for example, via a eutectic bond (e.g., an Aluminum-Germanium bond). As an example, the substrate 304 can comprise a printed circuit board, ceramic, molded package, laminate, and/or leadframe, etc. In one example, the substrate 304 can route signals from the ICs to the pins on the outside of the microphone package 102.

Figure 4A:
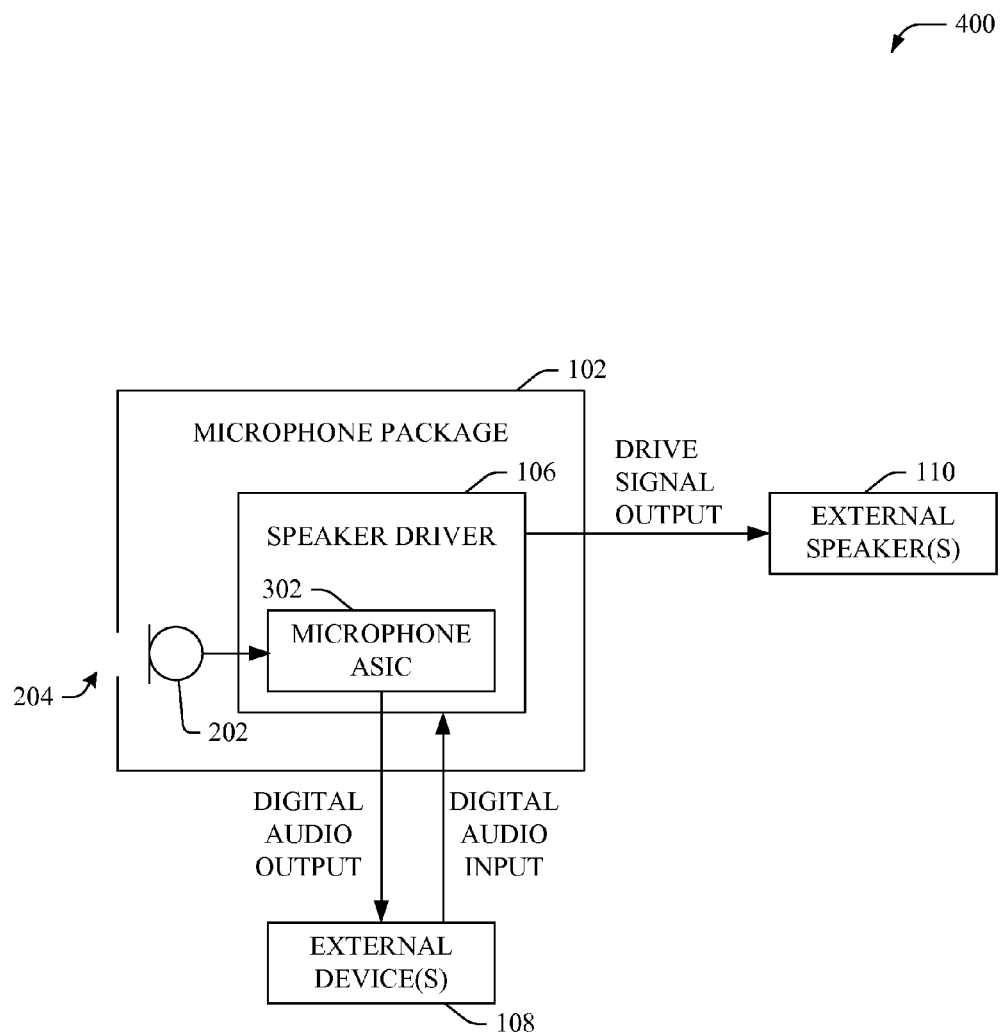
FIGS. 4A and 4B illustrate example systems comprising a speaker driver and a microphone ASIC that are implemented as a stacked-die solution.
Figure 4B:
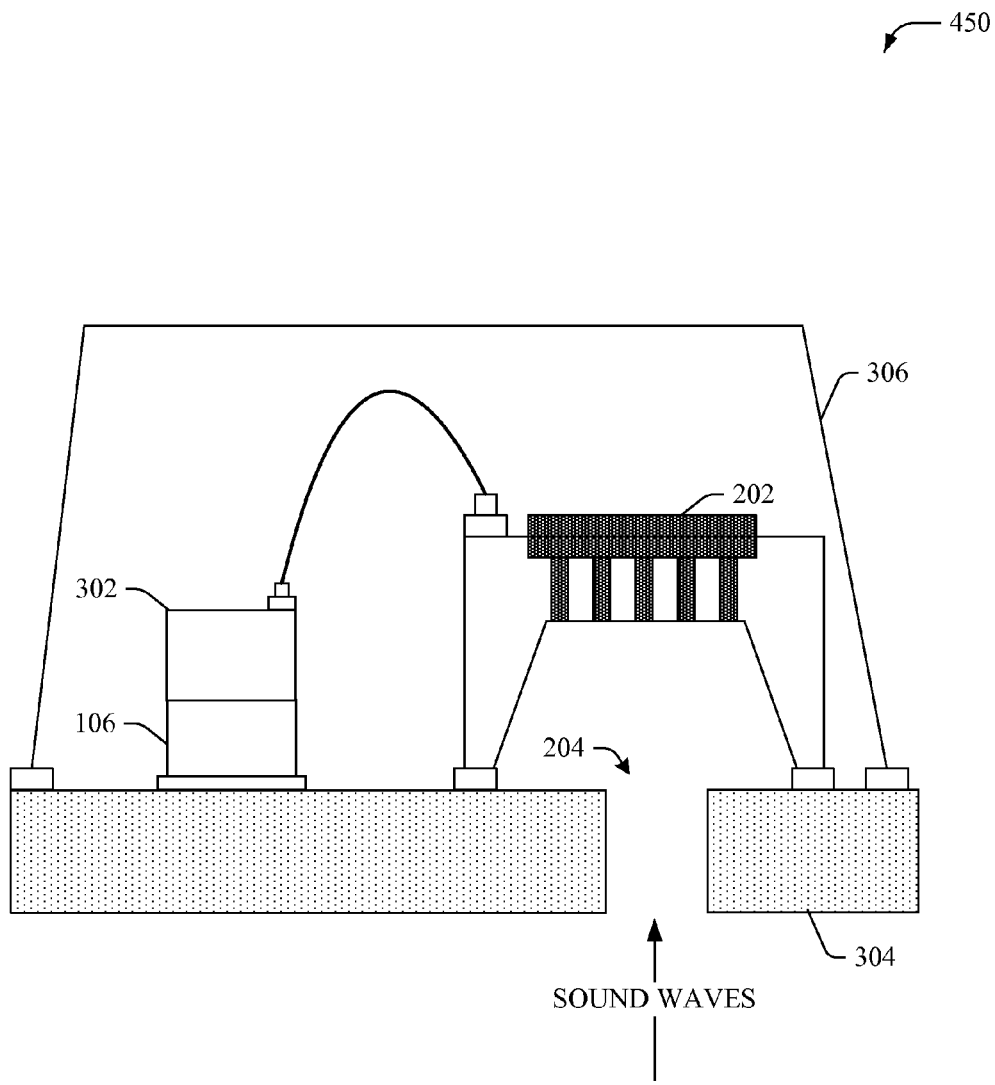

Referring now to FIGS. 4A and 4B, there illustrated are example systems 400 and 450 that depict another configuration for a microphone package with a built-in speaker driver. In one aspect, the speaker driver 106 and the microphone ASIC 302 can be implemented as a stacked-die. Moreover, the microphone ASIC 302 can be placed upright over the speaker driver 106. It is noted that the microphone package 102, speaker driver 106, external device(s) 108, external speaker(s) 110, microphone transducer 202, port hole 204, microphone ASIC 302, package substrate 304, and cover 306 can include functionality as more fully described herein, for example, as described above with regard to systems 100-350. FIG. 4A depicts an example block diagram illustrating the speaker driver 106 and the microphone ASIC 302 implemented as a stacked-die within the microphone package 102, while FIG. 4B depicts an example cross-sectional side-view of the speaker driver 106 and the microphone ASIC 302 implemented as a stacked-die within the microphone package 102. In one example, the microphone transducer 202 can be coupled to the microphone ASIC 302 via a wire bond. Further, the microphone transducer 202 and the speaker driver 106 can be coupled to the substrate 304 via eutectic bonds. Alternatively, the microphone transducer 202 and/or the speaker driver 106 can be coupled to the substrate 304 via wire bonds (not shown)

Figure 5A:
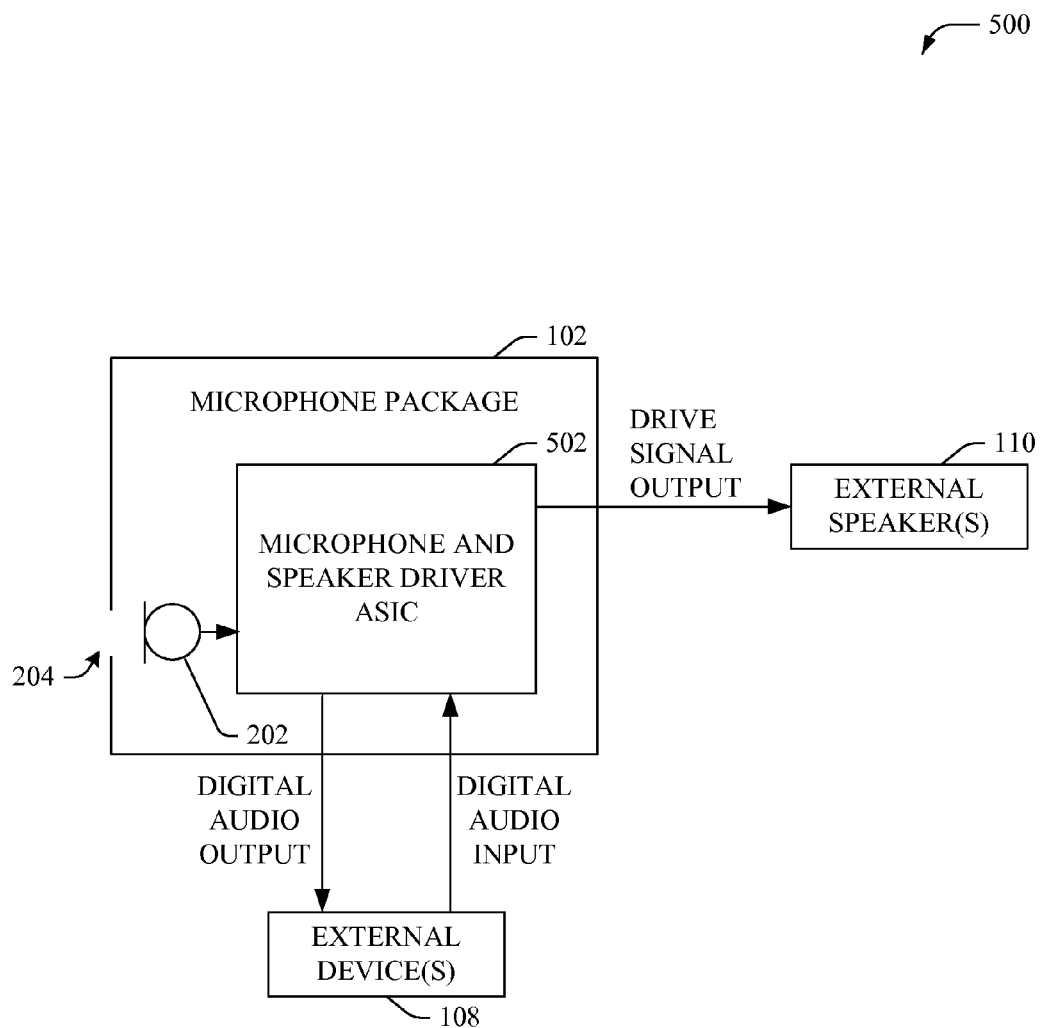
FIGS. 5A and 5B illustrate example systems comprising a speaker driver and a microphone ASIC that are implemented as a single die.
Figure 5B:
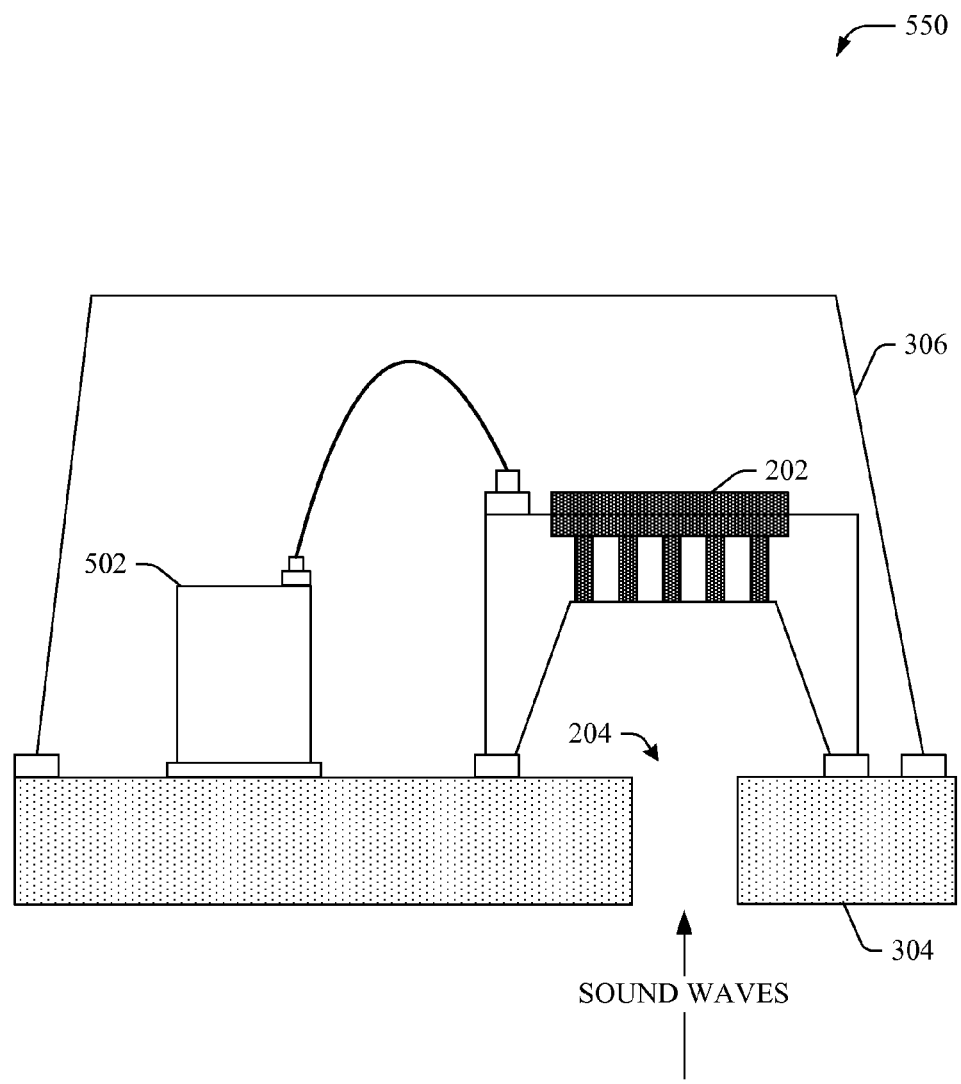

FIGS. 5A and 5B illustrate example systems 500 and 550 that depict yet another configuration for a microphone package with a built-in speaker driver. In one aspect, the microphone package 102 comprises a microphone and speaker driver ASIC 502 that includes functionality as more fully described herein, for example, as described above with regard to the speaker driver 106 and the microphone ASIC 302. Moreover, the speaker driver 106 and the microphone ASIC 302 are implemented as a single die via the microphone and speaker driver ASIC 502. It is noted that the microphone package 102, external device(s) 108, external speaker(s) 110, microphone transducer 202, port hole 204, package substrate 304, and cover 306 can include functionality as more fully described herein, for example, as described above with regard to systems 100-450. FIG. 5A depicts an example block diagram illustrating the microphone package 102 with the microphone and speaker driver ASIC 502, implemented as a single die, while FIG. 5B depicts an example cross-sectional side-view of the microphone package 102 with the microphone and speaker driver ASIC 502 implemented as a single die. As an example, the microphone transducer 202 can be coupled to the microphone and speaker driver ASIC 502 via a wire bond. Further, the microphone transducer 202 and the microphone and speaker driver ASIC 502 can be coupled to the substrate 304 via eutectic bonds. Alternatively, the microphone transducer 202 and/or the microphone and speaker driver ASIC 502 can be coupled to the substrate 304 via wire bonds (not shown).

Figure 6A:
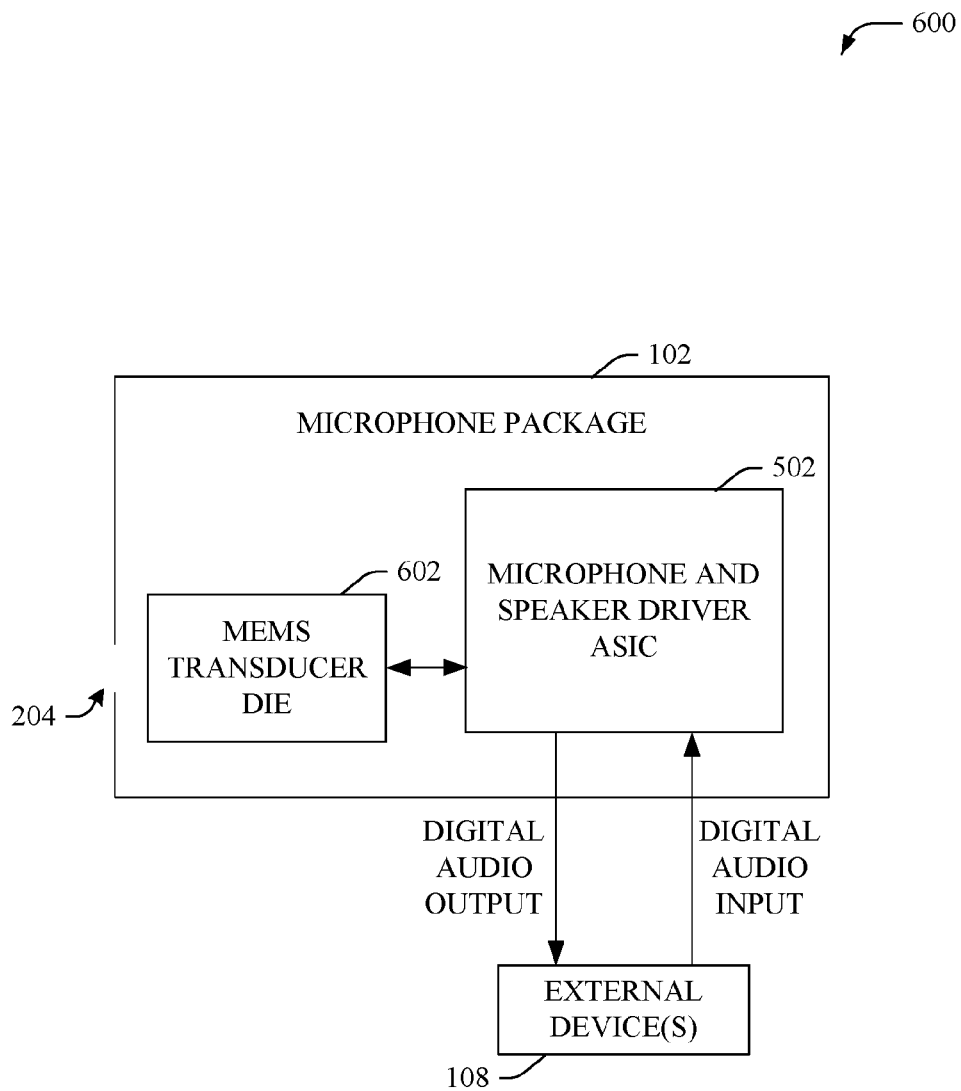
FIGS. 6A and 6B illustrate example systems comprising a microphone package that includes a microelectrical-mechanical systems (MEMS) transducer die for sensing and generating sound waves.
Figure 6B:
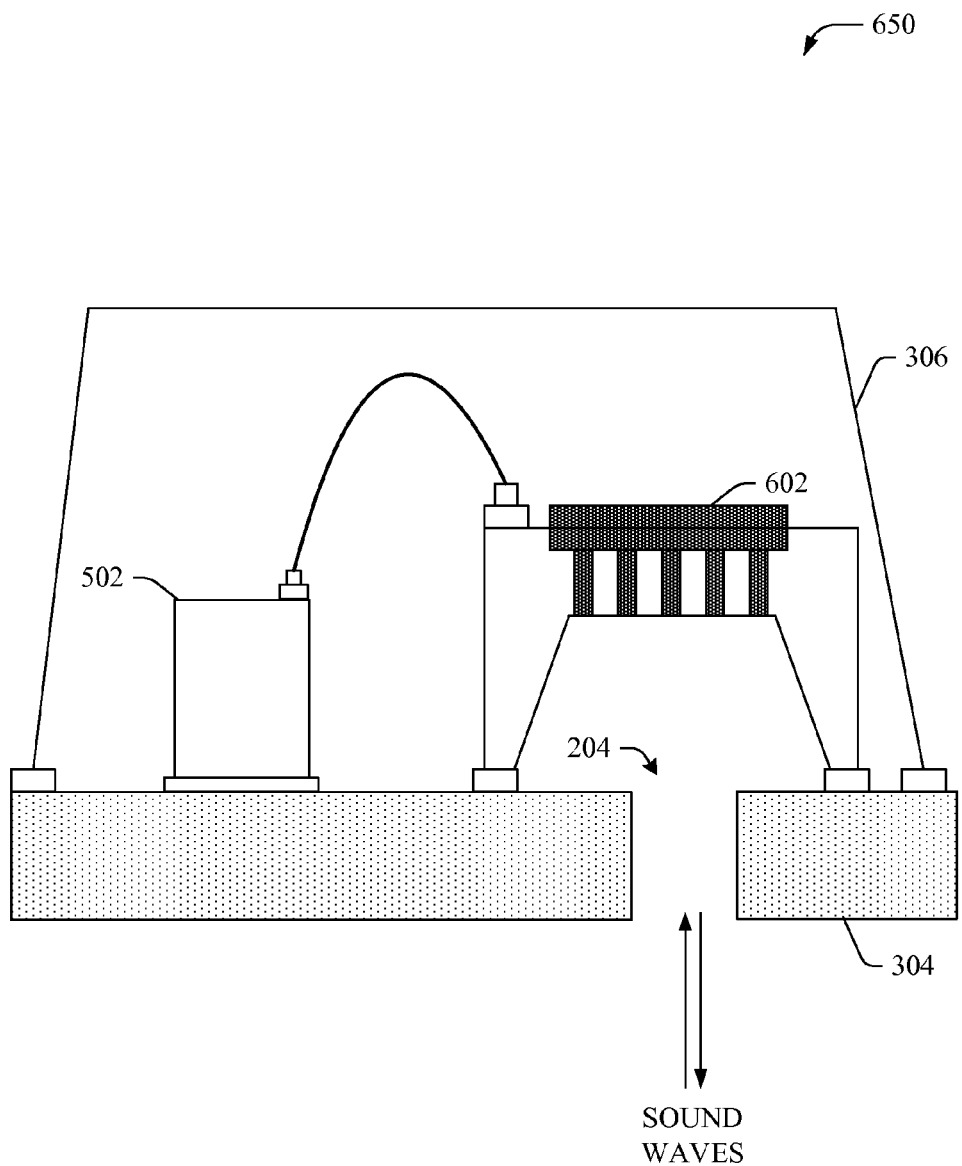

FIGS. 6A-6B illustrate example systems 600 and 650 wherein a MEMS die is utilized as both a microphone and a speaker. In one aspect, the microphone package 102 comprises a microphone and speaker driver ASIC 502 implemented on one or more die. Further, the microphone and speaker driver ASIC 502 can be coupled to a MEMS transducer die 602 that can both sense and generate sound waves. Moreover, the microphone and speaker driver ASIC 502 senses signals from the MEMS die 602 as a microphone and drives the MEMS die 602 as a speaker. The microphone and speaker driver ASIC 502 can include functionality as more fully described herein, for example, as described above with regard to the speaker driver 106 and the microphone ASIC 302. It is noted that the microphone package 102, external device(s) 108, port hole 204, package substrate 304, cover 306, and microphone and speaker driver ASIC 502 can include functionality as more fully described herein, for example, as described above with regard to systems 100-550. FIG. 6A depicts an example block diagram illustrating the microphone package 102 with the microphone and speaker driver ASIC 502 coupled to the MEMS transducer die 602, while FIG. 6B depicts an example cross-sectional side-view of the microphone package 102 with the microphone and speaker driver ASIC 502 coupled to the MEMS transducer die 602. The MEMS transducer die 602 can be coupled to the microphone and speaker driver ASIC 502 via a wire bond. Further, the MEMS transducer die 602 and the microphone and speaker driver ASIC 502 can be coupled to the substrate 304 via eutectic bonds. Alternatively, the MEMS transducer die 602 and/or the microphone and speaker driver ASIC 502 can be coupled to the substrate 304 via wire bonds (not shown).

It is noted that the design of systems 100-650 can include different material selections, topologies, etc., to achieve efficient audio wave sensing (and/or transmission). Moreover, it is noted that the microphone circuit 104, speaker driver 106, microphone transducer 202, microphone ASIC 302, microphone and speaker driver ASIC 502, and/or MEMS transducer die 602 can include most any components and circuitry elements of any suitable value in order to implement the embodiments of the subject innovation.

Figure 7:
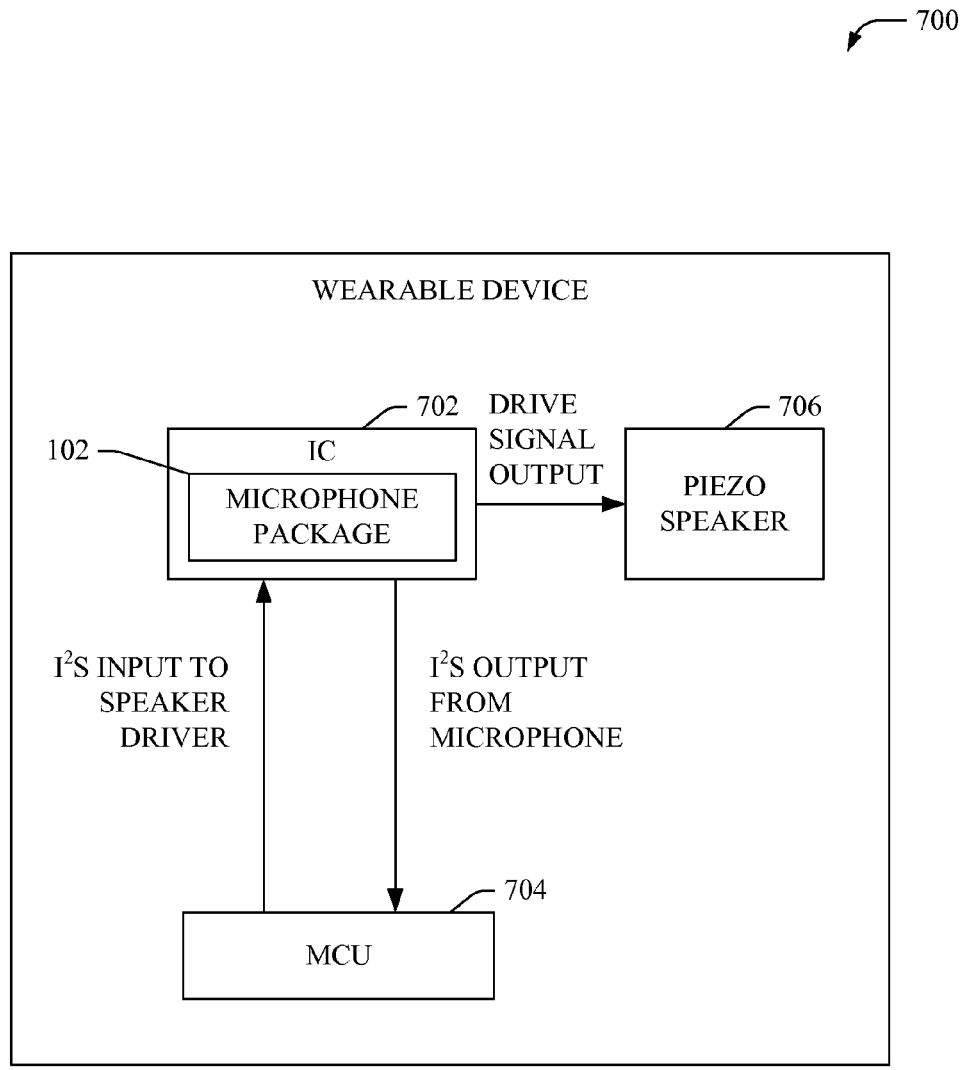
FIG. 7 illustrates an example wearable device that employs an Inter-IC Sound ($I^2S$) microphone.

Referring now to FIG. 7, there illustrated is an example wearable device 700 that employs an I²S microphone in accordance with an aspect of the disclosure. As an example, the wearable device 700 can include most any consumer electronic device, such as, but is not limited to, a smart watch, smart glasses, activity tracker, fitness monitor, medical device, etc. In one aspect, the wearable device 700 can be incorporated into items of clothing and/or accessories that are worn on the body. The wearable device 700 can perform one or more of the functions performed by a computing device (e.g., mobile phone, laptop, tablet, etc.) and/or perform additional tasks related to sensory and scanning features not typically seen in mobile and laptop devices, such as, but not limited to, biofeedback and/or tracking of physiological functions.

According to an embodiment, the wearable device can include the microphone package 102 within a built-in speaker driver as described more fully herein with respect to systems 100-650. The microphone package 102 can be implemented on IC 702 that can include addition components, for example, power management and/or hardware control components. The IC 702 can be a CMOS chip, for example. In one aspect, the microphone package 102 can provide an I²S output from a microphone (e.g., microphone transducer 202 and/or MEMS transducer die 602) to a microcontroller (MCU) 704 and can receive an I²S input from the MCU 704 that can be provided to the built-in speaker driver. The I²S output can provide a high signal-to-noise ratio (SNR) (e.g., 65 dB). As an example, the MCU 704 can process the I²S output signal to perform various functions, e.g., voice/keyword recognition, external device or system processor wake-up, control of the microphone, etc. It is noted that the system is not limited to I²S inputs/outputs and that most any decimated input/output audio formats can be utilized to eliminate the utilization of codecs.

The microphone package 102 can also provide an analog drive signal output (e.g., generated by the speaker driver) that drives a piezo speaker 706. Although most any speaker and/or corresponding speaker driver (e.g., class AB amplifier, class D amplifier, etc.) can be utilized, utilization of a piezo speaker 706 with a piezo speaker driver that is incorporated within the microphone package 102 provides several advantages. For example, utilization of a piezo speaker 706 and the piezo speaker driver can improve the form factor of the wearable device 700. Moreover, since piezo speakers and the piezo speaker drivers are very thin and small, they can be easily fitted within small wearable devices. Typically, the microphone package 102 is very small in size (e.g., 4×3×1 mm) and thus, the speaker driver die size is important criterion for selection of speakers and/or speaker drivers. As an example, piezo speaker drivers utilize a high voltage swing that is generated by a charge pump enabling minimization of an output stage to make a smaller speaker driver that fits within the microphone package 102. Moreover, the charge pump of the piezo speaker driver receives a small voltage signal from a battery (e.g., external to the microphone package) and generates a high voltage rail required to drive a piezo speaker. Similarly, a charge pump of the microphone transducer receives a small voltage signal from a battery and generates a high voltage rail required to drive the microphone transducer. In one aspect, the frequencies of the charge pump utilized by the piezo speaker driver can be synchronized with the frequencies of the charge pump utilized by the microphone transducer to reduce/avoid rolling into the audio band. It is appreciated that the subject specification is not limited to utilization of piezo speakers and/or piezo speaker drivers and that most any audio speaker technology can be utilized.

Figure 8:
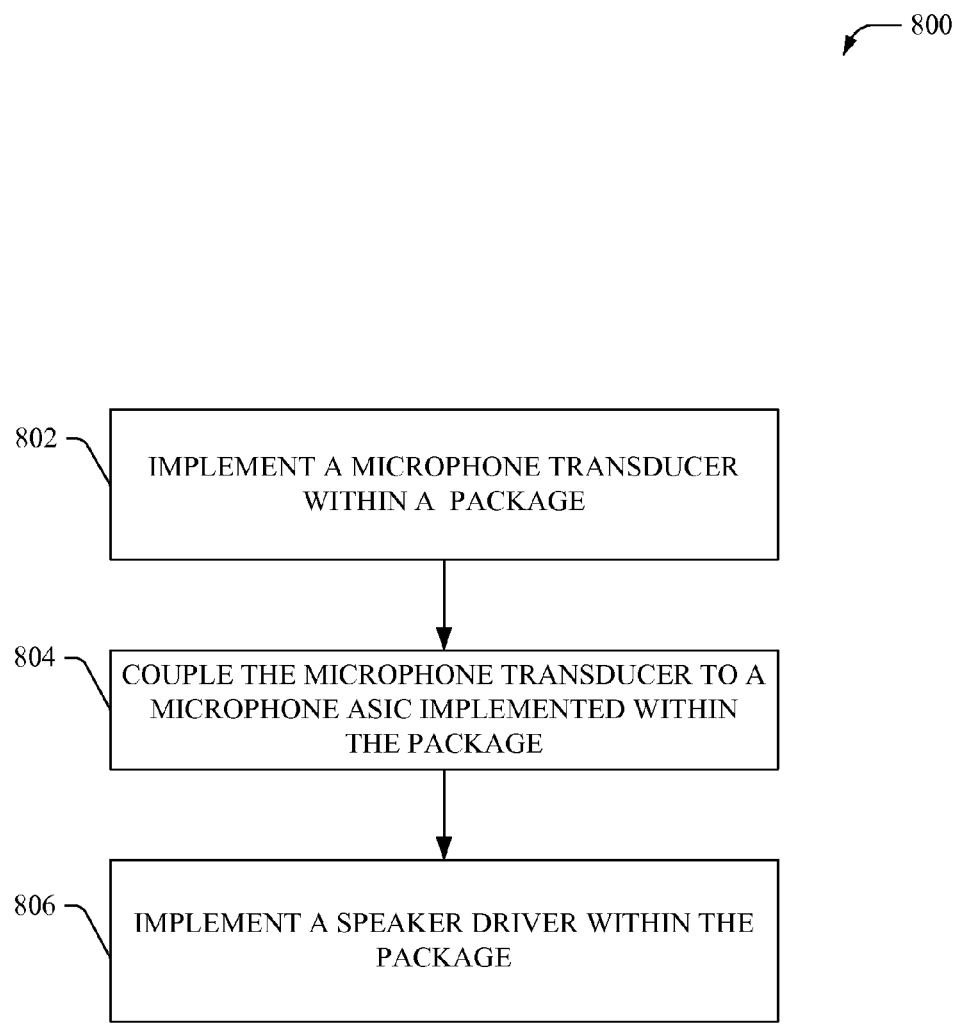
FIG. 8 illustrates an example methodology for forming a microphone package with a built-in speaker driver.
Figure 9:
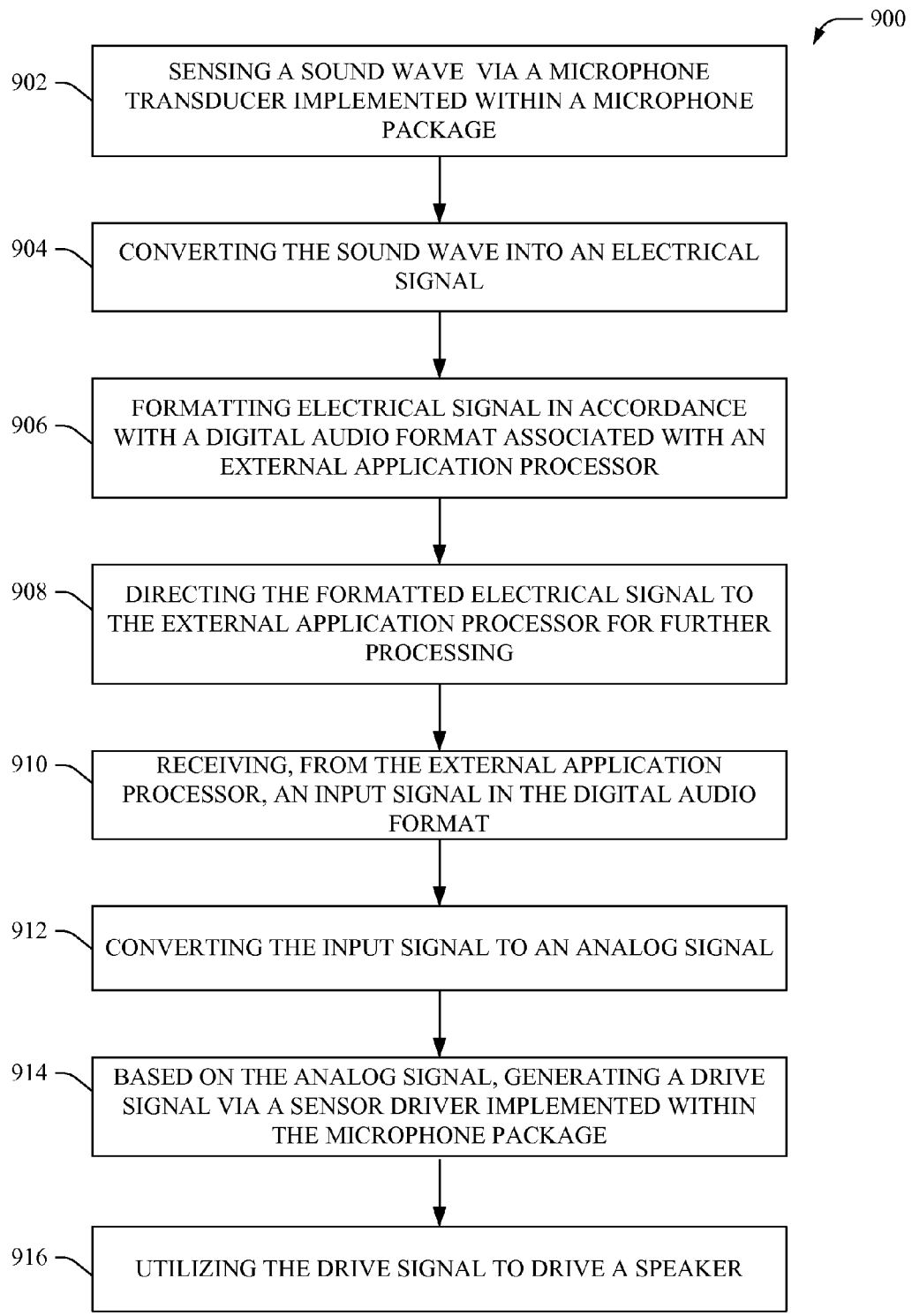
FIG. 9 illustrates an example methodology for utilizing a common package to sense and generate an acoustic/audio signal.

FIGS. 8-9 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device or computer-readable storage/communications media.

FIG. 8 illustrates an example methodology 800 for forming a microphone package with a built-in speaker driver in accordance with an aspect of the subject disclosure. Specifically, methodology 800 enables integration of a speaker driver within a microphone package that can be directly coupled to an external AP, eliminating a need for a codec and thus reducing the size, cost, and/or complexity of a device.

At 802, a microphone transducer can be implemented within a package. The microphone transducer can convert sound waves into electrical signals. As an example, the microphone transducer can be a MEMS microphone device that is coupled to a substrate (e.g., with conductive or non-conductive epoxy) of the package. As an example, the substrate can comprise a printed circuit board, ceramic, molded package, laminate, and/or leadframe, etc. In one aspect, the coupling comprises wire-bonding the MEMS microphone device to the substrate. In another aspect, the coupling comprises forming a eutectic bond between the MEMS microphone device and the substrate. Further, at 802, the microphone transducer can be coupled to a microphone ASIC implemented within the package. for example, the microphone transducer can be coupled to a microphone ASIC via a wire bond. The microphone ASIC digitizes and decimates the electrical signals and provides a digital audio output (e.g., in an I$^2$S format) to an external AP.

At 806, a speaker driver can be implemented within the package. The speaker driver can receive a digital audio input (e.g., in an I$^2$S format) from the external AP and generate a drive signal to drive a speaker. In one aspect, the speaker driver and the microphone ASIC are implemented as separate dice mounted on the package substrate. In another aspect, the speaker driver and the microphone ASIC are implemented as stacked die. In yet another aspect, the speaker driver and the microphone ASIC are implemented as a single die.

FIG. 9 illustrates an example methodology 900 for utilizing a common package to sense and generate acoustic/audio signals, according to an aspect of the subject disclosure. In one aspect, methodology 900 can be performed by a microphone and a speaker driver that are enclosed within a common package. At 902, a sound wave can be sensed via a microphone transducer (e.g., MEMS microphone) implemented within a microphone package. At 904, the sound wave can be converted into electrical signal and at 906, the electrical signal can be formatted in accordance with a digital audio format (e.g., I$^2$S format) associated with an external (e.g., external to the microphone package) AP. As an example, the formatting can include filtering a digitized version of the electrical signal to a defined sampling rate (e.g., baseband rate). At 908, the formatted electrical signal can be directed to the external AP for further processing. Since the formatted electrical signal is provided to the external AP in the digital audio format, the need to utilize a codec is eliminated.

At 910, an input signal can be received from the external AP in the digital audio format. At 912, the input signal can be converted into an analog signal. Further, at 914, based on the analog signal, a drive signal can be generated via a speaker driver implemented within the microphone package and at 916, the drive signal can be utilized to drive a speaker (e.g., external and/or internal to the microphone package). As an example, a piezo speaker driver and a piezo speaker can be utilized. The speaker can generate sound waves corresponding to the drive signal.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

In particular and in regard to the various functions performed by the above described components, devices, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems have been described with respect to interaction between several components. It can be appreciated that such systems and/or components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, may be provided to communicatively couple to such sub-components in order to provide integrated functionality. Any components described herein may also interact with one or more other components not specifically described herein.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A microphone package, comprising:
a microphone application-specific integrated circuit (ASIC), coupled to a microphone transducer, that generates a digital audio output signal based on sensing an acoustical signal; and
a speaker driver that generates, based on a digital audio input signal, a drive signal employable to drive a speaker, wherein a first frequency of a first charge pump utilized by the speaker driver is synchronized with a second frequency of a second charge pump utilized by the microphone transducer.

2. The microphone package of claim 1, wherein the microphone ASIC and the speaker driver are implemented as separate dice on a substrate of the microphone package.

3. The microphone package of claim 1, wherein the microphone ASIC and the speaker driver are implemented as a stacked die on a substrate of the microphone package.

4. The microphone package of claim 1, wherein the microphone ASIC and the speaker driver are implemented as a single die on a substrate of the microphone package.

5. The microphone package of claim 1, wherein the microphone transducer generates an analog electrical signal based on the sensing.

6. The microphone package of claim 5, wherein the microphone ASIC comprises a buffer amplifier that amplifies the analog electrical signal.

7. The microphone package of claim 6, wherein the microphone ASIC comprises an analog-to-digital converter that generates a digital electrical signal based on the analog electrical signal.

8. The microphone package of claim 7, wherein the microphone ASIC comprises a decimator that filters the digital electrical signal based on modifying a sampling rate associated with the digital electrical signal.

9. The microphone package of claim 8, wherein the decimator generates the digital audio output signal based on formatting the digital electrical signal in accordance with a defined digital audio format.

10. The microphone package of claim 9, wherein the defined digital audio format comprises at least one of an Inter-IC Sound ($I^2S$), a SLIMbus, a SoundWire, or a time division multiplexed (TDM) format.

11. The microphone package of claim 1, wherein the digital audio output signal is directed to an application processor external to the microphone package.

12. The microphone package of claim 1, wherein the digital audio output signal is in accordance with a pulse density modulation (PDM) format.

13. The microphone package of claim 1, wherein the digital audio input signal is received from an application processor external to the microphone package.

14. The microphone package of claim 1, wherein the microphone transducer comprises a Microelectromechanical systems (MEMS) transducer die.

15. The microphone package of claim 14, wherein the drive signal drives the MEMS transducer die to operate as the speaker.

16. The microphone package of claim 1, wherein the speaker is external to the microphone package.

17. The microphone package of claim 1, wherein the speaker is a piezo speaker and the speaker driver is a piezo speaker driver.

18. A method, comprising:
implementing a microphone transducer within a package;
coupling the microphone transducer to a microphone application-specific integrated circuit (ASIC) implemented within the package;
implementing a speaker driver within the package; and
synchronizing a first frequency of a first charge pump utilized by the speaker driver with a second frequency of a second charge pump utilized by the microphone transducer.

19. The method of claim 18, wherein the implementing the speaker driver comprises implementing the speaker driver and the microphone ASIC as separate dice on a substrate of the package.

20. The method of claim 18, wherein the implementing the speaker driver comprises implementing the speaker driver and the microphone ASIC as stacked die on a substrate of the package.

21. The method of claim 18, wherein the implementing the speaker driver comprises implementing the speaker driver and the microphone ASIC as a single die on a substrate of the package.

22. An integrated circuit, comprising:
a microphone application-specific integrated circuit (ASIC) coupled to a microphone transducer that is configured to direct, to an external device, a digital audio output signal that is determined based on sensing an acoustical signal; and
a speaker driver that is configured to generate, based on a digital audio input signal received from the external device, a drive signal employable to drive a speaker,
wherein the microphone ASIC and the speaker driver are implemented within a common package, and
wherein a first charge pump utilized by the speaker driver employs a first frequency that is synchronized with a second frequency of a second charge pump that is utilized by the microphone transducer.

23. The integrated circuit of claim 22, wherein the digital audio output signal and the digital audio input signal comply with at least one of an Inter-IC Sound ($I^2S$), a pulse density modulation (PDM), a SLIMbus, a SoundWire, or a time division multiplexed (TDM) format.

24. The integrated circuit of claim 22, wherein the speaker is a piezo speaker.

25. A system, comprising:
an application processor;
a piezo speaker; and
a microphone package comprising:
a microphone transducer that senses an acoustical signal;
a microphone application-specific integrated circuit (ASIC) coupled to the microphone transducer that generates a digital audio output signal based on the acoustical signal, wherein the digital audio output signal is provided to the application processor; and
a piezo speaker driver that receives a digital audio input signal from the application processor and generates a drive signal that drives the piezo speaker, wherein a first frequency of a first charge pump utilized by the piezo speaker driver is synchronized with a second frequency of a second charge pump utilized by the microphone transducer.

26. The system of claim 25, wherein the microphone package comprises:
the first charge pump that increases a first voltage signal, received from a battery, to drive the microphone transducer; and the second charge pump that increases a second voltage signal, received from the battery, to drive the piezo speaker.

27. The system of claim 25, wherein the system comprises a wearable device.

\* \* \* \* \*